(12) United States Patent
Kim et al.

(10) Patent No.: US 11,832,406 B2
(45) Date of Patent: Nov. 28, 2023

(54) DISPLAY DEVICE

(71) Applicant: Samsung Display Co., LTD., Yongin-si (KR)

(72) Inventors: Tae-Chang Kim, Anyang-si (KR); Soyoun Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 76 days.

(21) Appl. No.: 17/525,954

(22) Filed: Nov. 14, 2021

(65) Prior Publication Data

US 2022/0272853 A1  Aug. 25, 2022

(30) Foreign Application Priority Data

Feb. 23, 2021 (KR) .......................... 10-2021-0024280

(51) Int. Cl.
*H05K 5/00* (2006.01)
*H05K 5/02* (2006.01)

(52) U.S. Cl.
CPC ......... *H05K 5/0226* (2013.01); *H05K 5/0017* (2013.01)

(58) Field of Classification Search
None
See application file for complete search history.

(56) References Cited

U.S. PATENT DOCUMENTS

| | | |
|---|---|---|
| 9,864,412 B2 | 1/2018 | Park et al. |
| 10,152,086 B2 | 12/2018 | Choi et al. |
| 10,938,970 B1 * | 3/2021 | Lee .................... H04M 1/0268 |
| 11,375,628 B2 | 6/2022 | Zhang et al. |
| 11,570,914 B2 * | 1/2023 | Endo .................. H01L 27/1218 |
| 2013/0058063 A1 | 3/2013 | O'Brien |

(Continued)

FOREIGN PATENT DOCUMENTS

| | | |
|---|---|---|
| CN | 110706598 | 1/2020 |
| CN | 111739421 | 10/2020 |
| CN | 111933028 | 11/2020 |

(Continued)

OTHER PUBLICATIONS

Extended European Search Report dated Jul. 14, 2022, for European Patent Application No. 22151087.8.

*Primary Examiner* — Anthony Q Edwards
*Assistant Examiner* — Rashen E Morrison
(74) *Attorney, Agent, or Firm* — H.C. Park & Associates, PLC

(57) ABSTRACT

A display device includes a first display area, a second display area, a third display area having a curved shape, and a fourth display area. The display device includes a display panel, an inner cover member, a first outer cover, and a hinge member. The display panel overlaps the first, second, third, and fourth display areas. The inner cover member covers an outer periphery of the display panel overlapping the first, second, and third display areas. The first outer cover member surrounds the inner cover member. The hinge member is disposed on a bottom surface of the display panel to overlap a boundary between the second display area and the fourth display area, and is connected to the first outer cover member. The display panel is folded and unfolded through the hinge member. The inner cover member is drawn in to and out from the first outer cover member.

38 Claims, 12 Drawing Sheets

(56) References Cited

U.S. PATENT DOCUMENTS

2017/0360170 A1   12/2017   Lin et al.

FOREIGN PATENT DOCUMENTS

| KR | 10-2016-0134365 | 11/2016 |
| KR | 10-2016-0148116 | 12/2016 |
| KR | 10-2016-0148141 | 12/2016 |
| KR | 10-1784880 | 9/2017 |

* cited by examiner

DISPLAY DEVICE

CROSS-REFERENCE TO RELATED APPLICATION

This application claims priority from and the benefit of Korean Patent Application No. 10-2021-0024280, filed on Feb. 23, 2021, which is hereby incorporated by reference for all purposes as if fully set forth herein.

BACKGROUND

Field

Embodiments of the invention relate generally to a display device and more specifically, to a foldable and rollable display device.

Discussion of the Background

Flat panel display devices are used as display devices for replacing a cathode ray tube display device due to lightweight and thin characteristics thereof. A liquid crystal display device and an organic light emitting diode display device are representative examples of such flat panel display devices.

Recently, a lower substrate and an upper substrate of a display panel included in such a display device may include a flexible material, and a foldable display device in which a part of the display panel may be repeatedly folded and unfolded has been developed. For example, the display panel may include a polyimide substrate and a thin film encapsulation structure so as to have flexibility. In addition, the foldable display device may display an image even in a portion in which the display panel is folded. In other words, the foldable display device may include a display area for displaying an image, and a part of the display area may be folded.

The above information disclosed in this Background section is only for understanding of the background of the inventive concepts, and, therefore, it may contain information that does not constitute prior art.

SUMMARY

Display devices constructed according to the principles of the invention are capable of performing a folding operation and a sliding operation to provide a wide display area and a compact size of the display devices.

Additional features of the inventive concepts will be set forth in the description which follows, and in part will be apparent from the description, or may be learned by practice of the inventive concepts.

According to an aspect of the invention, a display device having a first display area, a second display area, a third display area, and the fourth display area, the third display area disposed between the first and second display areas and having a curved shape, the fourth display area disposed on one side of the second display area. The display device includes a display panel, an inner cover member, a first outer cover, and a hinge member. The display panel overlaps the first, second, third, and fourth display areas. The inner cover member covers an outer periphery of the display panel that overlaps the first, second, and third display areas. The first outer cover member surrounds the inner cover member. The hinge member is disposed on a bottom surface of the display panel to overlap a boundary between the second display area and the fourth display area, and is connected to the first outer cover member. The display panel is configured to be folded and unfolded through the hinge member, and the inner cover member is configured to be drawn in to and out from the first outer cover member.

The display device may be configured to display an image in the third display area having the curved shape.

The display device may further include a second outer cover member connected to the hinge member, and the second outer cover member may cover an outer periphery of the display panel that overlaps the fourth display area.

When the first outer cover member and the second outer cover member are folded through the hinge member, the first outer cover member and the second outer cover member may be in contact with each other. When the first outer cover member and the second outer cover member are unfolded through the hinge member, the first outer cover member and the second outer cover member may be arranged in a first direction.

The display device may further include a power supply member disposed inside the second outer cover member.

The display device may further include a first protective layer disposed on the display panel to surround the display panel that overlaps the first, second, and third display areas.

The inner cover member may be connected to at least one side surface of the first protective layer such that the inner cover member fixes the first protective layer.

The first protective layer may have a curved shape in the third display area.

A bottom surface of the first protective layer may be in contact with the display panel. When the inner cover member is drawn out from the first outer cover member in a first direction, the display panel may slide on the bottom surface of the first protective layer.

The display device may further include a second protective layer disposed on the first protective layer to overlap the first display area and a third protective layer disposed on the first protective layer to overlap the second display area.

The first outer cover member may be connected to at least one side of the second protective layer such that the first outer cover member fixes the second protective layer, and the first outer cover member may be connected to at least one side of the third protective layer such that the first outer cover member fixes the third protective layer.

The second protective layer and the third protective layer may not overlap the third display area, and the first protective layer may protrude through an opening defined by the second protective layer and the third protective layer.

When the inner cover member is drawn out from the first outer cover member in a first direction while the display panel is unfolded, a protruding area of the first protective layer exposed from the second protective layer and the third protective layer may be increased.

The display panel may display an image through the first, second, and third protective layers in the first and second display areas, and the display panel may display an image through the first protective layer in the third display area.

A top surface of the first protective layer may be in contact with a bottom surface of each of the second and third protective layers. When the inner cover member is drawn out from the first outer cover member in a first direction, the first protective layer may slide on the bottom surface of each of the second and third protective layers.

The display device may further include a second outer cover member and a fourth protective layer. The second outer cover member may be connected to the hinge member, and may cover an outer periphery of the display panel that overlaps the fourth display area. The fourth protective layer may be disposed on the display panel that overlaps the fourth display area.

When the display panel is unfolded, a side surface of the first protective layer and a side surface of the fourth protective layer may be in contact with each other at the boundary between the second display area and the fourth display area.

When the inner cover member is drawn out from the first outer cover member in a first direction while the display panel is unfolded, a side surface of the first protective layer may be spaced apart from a side surface of the fourth protective layer.

The second outer cover member may be connected to at least one side of the fourth protective layer such that the second outer cover member fixes the fourth protective layer.

The display panel may display an image through the fourth protective layer in the fourth display area.

The display device may further include a first support member disposed on the bottom surface of the display panel that overlaps the first, second, and third display areas.

A bottom surface of the first support member may have a first concavo-convex structure in a portion that overlaps the first display area and the third display area, and a top surface of the first support member may be in contact with the bottom surface of the display panel.

The display device may further include a first rotation member. The first rotation member may be disposed under the first support member that overlaps the third display area, and may have a second concavo-convex structure engaged with the first concavo-convex structure of the first support member.

The display device may further include a second support member disposed on the bottom surface of the display panel overlapping the fourth display area, and a top surface of the second support member may be in contact with the bottom surface of the display panel.

The display device may further include a second rotation member spaced apart from an end of the display panel that overlaps the first display area.

The display device may further include a cover film wound around the second rotation member. One side of the cover film may be connected to the second rotation member, and an opposite side of the cover film may be connected to the end of the display panel.

When the inner cover member may be drawn out from the first outer cover member in a first direction while the display panel is unfolded, and the first rotation member may rotate in a clockwise direction such that the display panel overlapping the first display area is moved to the third display area and the display panel overlapping the third display area is moved to the second display area. The second rotation member may be configured to rotate in the clockwise direction such that a part of the cover film overlaps the first display area.

When the display panel is unfolded, the first display area may be used to display an image on a bottom surface of the display device, and the second display area and the fourth display area may be used to display an image on a top surface of the display device. The third display area may be used to display an image on a side surface of the display device.

The display panel may be integrally formed in the first, second, third, and fourth display areas.

According to another aspect of the invention, a display device includes a first display area, a second display area, a third display area, a fourth display area, and a hinge area, the third display area disposed between the first and second display areas and having a curved shape, the fourth display area disposed on one side of the second display area, the hinge area disposed between the second display area and the fourth display area, and the display device includes a display panel, a first support member, a hinge member, and a first rotation member. The display panel overlaps the first, second, third, and fourth display areas and the hinge area. The first support member is disposed on a bottom surface of the display panel, and includes a first extension area overlapping the first display area, a second extension area overlapping the third display area, and a support area overlapping the second display area. The hinge member is disposed in the hinge area on the bottom surface of the display panel. The first rotation member is disposed in the second extension area on a bottom surface of the first support member. The display panel is configured to be folded and unfolded through the hinge member, and the display panel is configured to be drawn in and out through the first rotation member.

The display device may display an image in the third display area having the curved shape.

The bottom surface of the first support member that overlaps the first extension area and the second extension area may have a first concavo-convex structure. The first rotation member may have a second concavo-convex structure engaged with the first concavo-convex structure of the first support member. A top surface of the first support member may be in contact with the bottom surface of the display panel.

The display device may further include a second support member disposed in the fourth display area on the bottom surface of the display panel, and a top surface of the second support member may be in contact with the bottom surface of the display panel.

The display device may further include a second rotation member spaced apart from an end of the display panel that overlaps the first display area and a cover film wound around the second rotation member. One side of the cover film may be connected to the second rotation member, and an opposite side of the cover film may be connected to the end of the display panel.

When the display panel is drawn out in a first direction while the display panel is unfolded, the first rotation member may rotate in a clockwise direction such that a part of the first extension area of the first support member is moved to the third display area and a part of the second extension area of the first support member is moved to the second display area. The second rotation member may rotate in the clockwise direction such that a part of the cover film overlaps the first display area.

When the display panel is unfolded, the first display area may be used to display an image on a bottom surface of the display device, and the second and fourth display areas may be used to display an image on a top surface of the display device. The third display area may be used to display an image on a side surface of the display device.

The display panel may be integrally formed in the first, second, third, and fourth display areas.

According to another aspect of the invention, a display device includes: a display panel having a first display area, a second display area, a third display area having a curved shape, and a fourth display area; a rotation member configured to modify a size of the first display area and a size of the second display area and disposed on the third display area; and a hinge member configured to fold and unfold the fourth display area and disposed on a boundary between the second display area and the fourth display area, wherein: the first display area is configured to display an image in a first direction; the second display area and the fourth display area are configured to display the image in a second direction opposite to the first direction, and the third display area is configured to display the image in a third direction, and wherein: the size of the first display area is decreased by a rotation of the rotation member, and the size of the second display area is increased by the rotation of the rotation member.

In the display device in accordance with embodiments, when the display device is folded, an image may be displayed through the display panel located in the first display area and the third display area. In addition, when the display device is unfolded, an image may be displayed through the display panel located in the first display area, the third display area, the second display area, and the fourth display area. Moreover, when the inner cover member is slid from the first outer cover member, an area for displaying an image in a third direction that is orthogonal to the first and second directions may be relatively increased. Accordingly, the display device may function as a foldable display device and a slidable display device.

In addition, according to the display device, one display panel may be disposed in the first, second, third, and fourth display areas. In this case, when the display device is folded, the display panel may be used to display an image in the first display area and the third display area without adding a display panel for displaying the image in the first display area and the third display area, such that a manufacturing cost of the display device may be relatively reduced.

Moreover, since the image is displayed from the display panel that overlaps the third display area, the image may also be displayed on a curved side surface of the display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
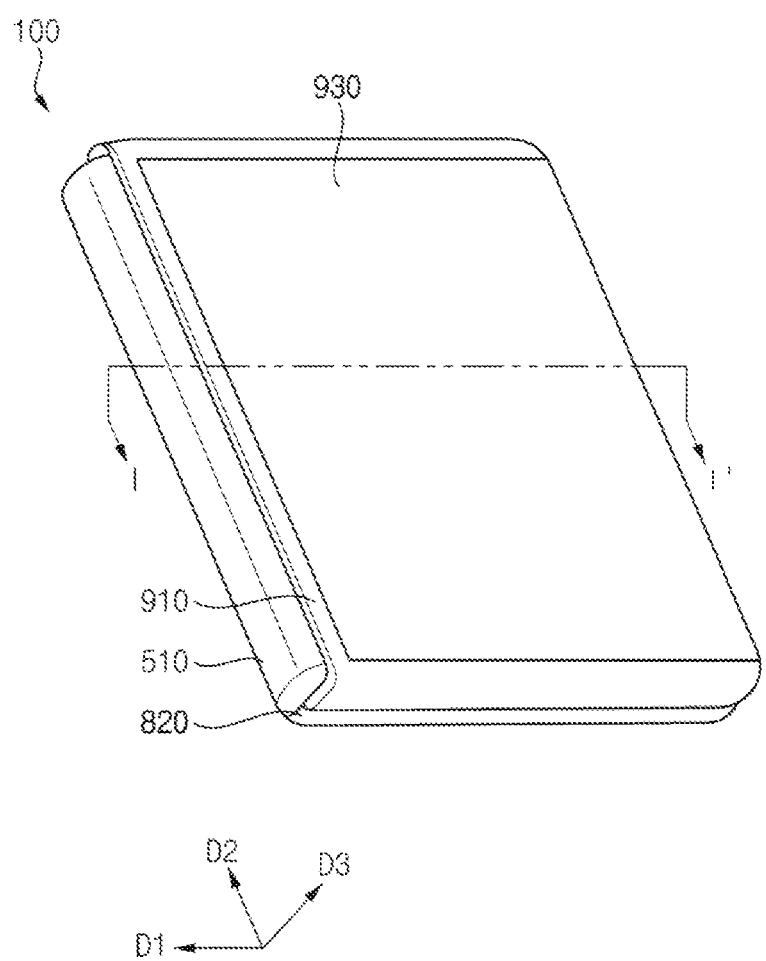
FIG. 1 is a perspective view of an embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
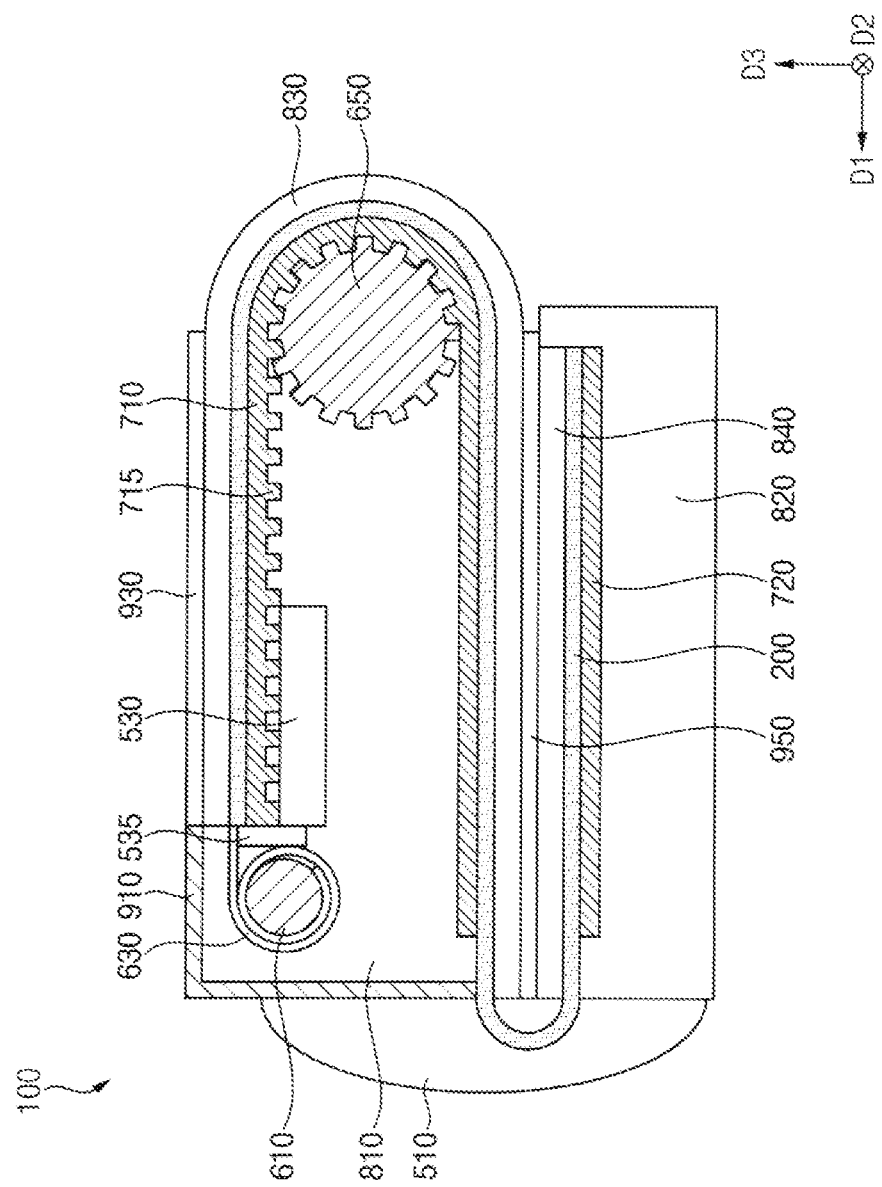
FIG. 2 is a cross-sectional view taken along line I-I' of FIG. 1.
Figure 3:
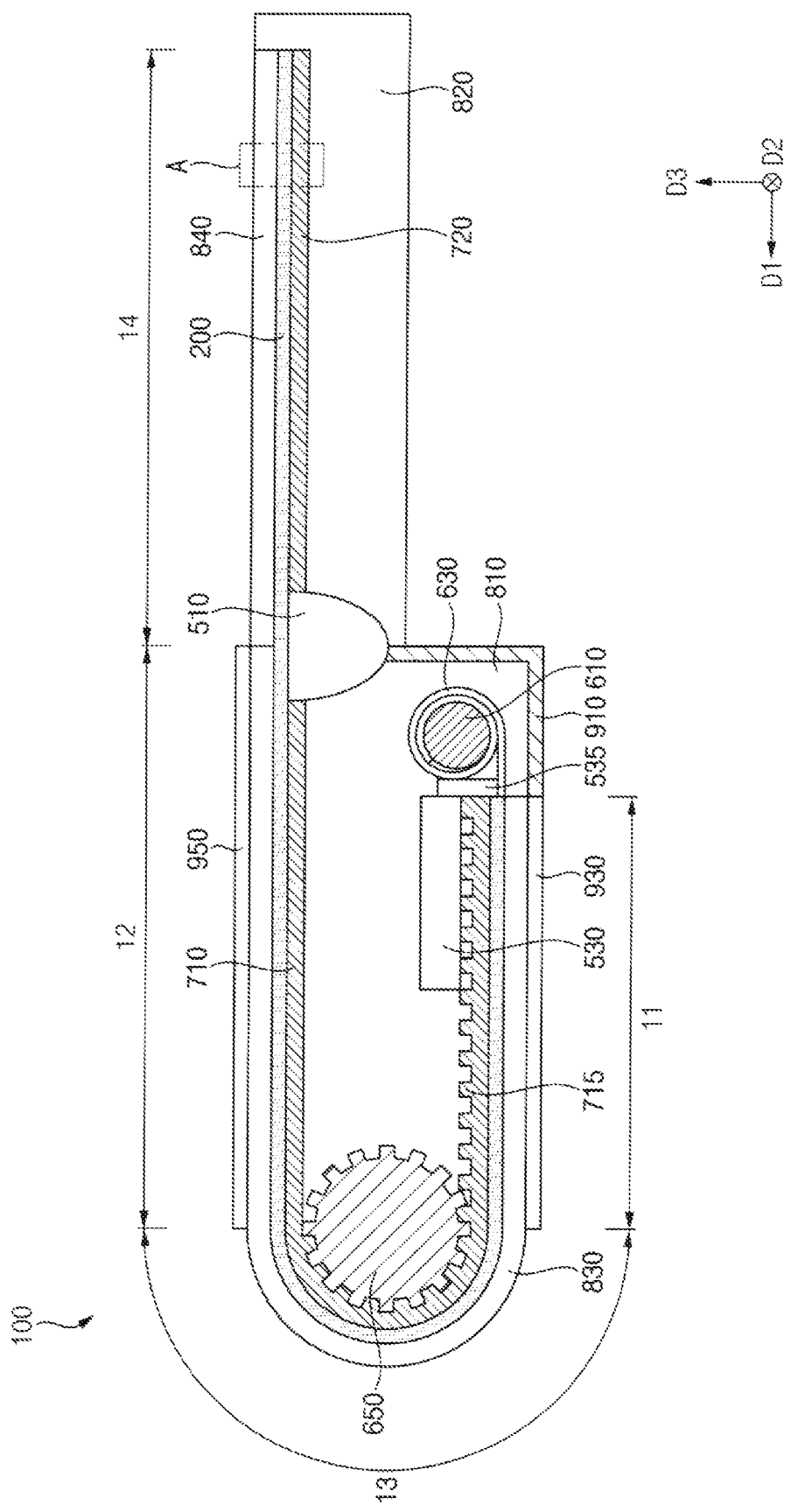
FIG. 3 is a cross-sectional view showing a state in which the display device of FIG. 2 is unfolded.

FIG. 1 is a perspective view showing a display device according to embodiments, and FIG. 2 is a cross-sectional view showing taken along line I-I' of FIG. 1. FIG. 3 is a cross-sectional view showing a state in which the display device of FIG. 2 is unfolded. For example, FIGS. 1 and 2 show a state in which a display device 100 is folded.

Referring to FIGS. 1, 2, and 3, a display device 100 may include a display panel 200, a first outer cover member 910, a second outer cover member 820, an inner cover member 810, a hinge member 510, a first protective layer 830, a second protective layer 930, a third protective layer 950, a fourth protective layer 840, a first support member 710, a second support member 720, a first rotation member 650, a second rotation member 610, a cover film 630, a circuit board 530, a connection film 535, and the like.

As shown in FIGS. 2 and 3, the display device 100 may be folded (e.g., in-folded) and unfolded (e.g., out-folded). For convenience of description, a detailed description of the display device 100 will be given based on a state in which the display device 100 is unfolded.

Referring again to FIG. 3, the display device 100 may include a first display area 11, a second display area 12, a third display area 13, and a fourth display area 14. In this case, the third display area 13 may be located between the first display area 11 and the second display area 12, and may have a curved (e.g., rounded) shape. For example, the third display area 13 may connect between the first display area 11 and the second display area 12 in a curved (e.g., rounded) shape. In addition, the fourth display area 14 may be located on one side of the second display area 12. For example, the first display area 11, the third display area 13, the second display area 12, and the fourth display area 14 may be sequentially (e.g., consecutively) arranged. For example, when the display device 100 is unfolded, the first display area 11 may correspond to an area for displaying an image on a bottom surface of the display device 100, the second display area 12 and the fourth display area 14 may correspond to areas for displaying an image on a top surface of the display device 100, and the third display area 13 may correspond to an area for displaying an image on a side surface (e.g., a lateral surface) of the display device 100.

The display panel 200 may overlap the first, second, third, and fourth display areas 11, 12, 13, and 14. In embodiments, the display panel 200 may be integrally formed in the first, second, third, and fourth display areas 11, 12, 13, and 14, and an image may be displayed on a top surface of the display panel 200.

As the display device 100 is folded and unfolded, the display panel 200 may also be folded and unfolded. For example, the display panel 200 may be folded about a boundary between the second display area 12 and the fourth display area 14. In this case, a first portion of the display panel 200 that overlaps the second display area 12 and a second portion of the display panel 200 that overlaps the fourth display area 14 may face each other, and the display panel 200 located at a portion adjacent to the boundary may have a folded shape (see FIG. 2). In addition, when the display panel 200 is folded and unfolded, the display panel 200 that overlaps the third display area 13 may have a curved shape. For example, the display panel 200 that overlaps each of the first, second, and fourth display areas 11, 12, and 14 may have a flat shape.

The first protective layer 830 may be disposed on the display panel 200 to surround the display panel 200 that overlaps the first, second, and third display areas 11, 12, and 13. For example, the first protective layer 830 may have a flat shape in each of the first and second display areas 11 and 12, and may have a curved shape in the third display area 13. In other words, the first protective layer 830 may have a U-shape rotated in a clockwise direction by 90 degrees. In embodiments, although a bottom surface of the first protective layer 830 may be in contact with the display panel 200, the first protective layer 830 and the display panel 200 are not fixed to each other. For example, the display panel 200 may be configured to slip (e.g., slide) on the bottom surface of the first protective layer 830.

The first protective layer 830 may be transparent, and the first protective layer 830 may include tempered glass, ultra-thin glass (UTG), and the like. However, a material of the first protective layer 830 is not limited to the above materials. For example, the first protective layer 830 may include materials that are transparent and capable of protecting the display panel 200.

The inner cover member 810 may cover an outer periphery of each of the display panel 200 and the first protective layer 830 that overlap the first, second, and third display areas 11, 12, and 13. In embodiments, the inner cover member 810 may be connected to at least one side surface of the first protective layer 830 so that the inner cover member 810 may fix the first protective layer 830. For example, the first protective layer 830 may include first, second, third, and fourth side surfaces. The first side surface of the first protective layer 830 may be adjacent to the boundary between the second display area 12 and the fourth display area 14. The second side surface of the first protective layer 830 may be located opposite to the first side surface while being adjacent to the second rotation member 610 (e.g., the connection film 535). The third and fourth side surfaces of the first protective layer 830 may be located between the first and second side surfaces. In this case, the inner cover member 810 may surround the third side surface and the fourth side surface of the first protective layer 830, and the inner cover member 810 may not surround the first and second side surfaces of the first protective layer 830. In other words, the inner cover member 810 may fix the third side surface and the fourth side surface of the first protective layer 830. In addition, while the inner cover member 810 covers the third side surface and the fourth side surface of the first protective layer 830, the inner cover member 810 may cover a side surface of the display panel 200 located under the first protective layer 830, a side surface of the first support member 710 located under the display panel 200, the first rotation member 650, the second rotation member 610, the cover film 630, the circuit board 530, the connection film 535, and the like. For example, the inner cover member 810 may cover a space defined by the bottom surface of the first protective layer 830 having the U-shape, and the inner cover member 810, the first protective layer 830, and the first rotation member 650 may move together as a set. In other embodiments, the inner cover member 810 may surround the second, third, and fourth side surfaces of the first protective layer 830, or may surround all the first, second, third, and fourth side surfaces of the first protective layer 830. However, when the inner cover member 810 surrounds the first side surface, a bezel may be visually recognized between the second display area 12 and the fourth display area 14.

The inner cover member 810 may include steel use stainless (SUS), plastic, and the like. In some embodiments, the inner cover member 810 may include a metal, an alloy, and the like. For example, the inner cover member 810 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, a silver-containing alloy, a copper-containing alloy, a molybdenum-containing alloy, and the like. These materials may be used alone or in combination with each other. However, a material of the inner cover member 810 is not limited to the above materials. For example, the inner cover member 810 may include materials capable of protecting the first protective layer 830, the display panel 200, the first support member 710, the first rotation member 650, the second rotation member 610, the cover film 630, the circuit board 530, and the connection film 535.

The second protective layer 930 may be disposed on the first protective layer 830 to overlap the first display area 11. For example, the second protective layer 930 may have a flat shape in the first display area 11. In other words, the second protective layer 930 may have a bar shape. In embodiments, although a first surface (e.g., a bottom surface) of the second protective layer 930 is in contact with the first protective layer 830, the second protective layer 930 and the first protective layer 830 are not fixed to each other. For example, the first protective layer 830 may be configured to slide on the first surface of the second protective layer 930.

The second protective layer 930 may be transparent, and the second protective layer 930 may include tempered glass, ultra-thin glass (UTG), and the like. However, a material of the second protective layer 930 is not limited to the above materials. For example, the second protective layer 930 may include materials that are transparent and capable of protecting the first protective layer 830.

The third protective layer 950 may be disposed on the first protective layer 830 to overlap the second display area 12. For example, the third protective layer 950 may have a flat shape in the second display area 12. In other words, the third protective layer 950 may have a bar shape. In embodiments, although a first surface (e.g., a bottom surface) of the third protective layer 950 is in contact with the first protective layer 830, the third protective layer 950 and the first protective layer 830 are not fixed to each other. For example, the first protective layer 830 may be configured to slide on the first surface of the third protective layer 950. In other words, the first protective layer 830 may be configured to slide (e.g., during in and out operations) between the second and third protective layers 930 and 950. For example, the second and third protective layers 930 and 950 may not overlap the third display area 13, and a part of the first protective layer 830 may protrude in a first direction D1 through an opening defined by the second and third protective layers 930 and 950. For example, the part of the first protective layer 830 may be exposed from the second and third protective layers 930 and 950.

In embodiments, the display panel 200 may display an image through the first protective layer 830, the second protective layer 930, and the third protective layer 950 in the first and second display areas 11 and 12, and the display panel 200 may display an image through the first protective layer 830 in the third display area 13.

The third protective layer 950 may be transparent, and the third protective layer 950 may include tempered glass, ultra-thin glass (UTG), and the like. However, a material of the third protective layer 950 is not limited to the above materials. For example, the third protective layer 950 may include materials that are transparent and capable of protecting the first protective layer 830.

The first outer cover member 910 may surround the inner cover member 810. For example, the first outer cover member 910 may be connected to the hinge member 510. In embodiments, the first outer cover member 910 may be connected to at least one side of the second protective layer 930 so that the first outer cover member 910 may fix the second protective layer 930. For example, the first outer cover member 910 may be connected to at least one side of the third protective layer 950 so that the first outer cover member 910 may fix the third protective layer 950.

For example, the second protective layer 930 may include first, second, third, and fourth side surfaces. The first side surface of the second protective layer 930 may be adjacent to the second rotation member 610. The second side surface of the second protective layer 930 may face the first side surface while being adjacent to a boundary between the third display area 13 and the first display area 11. The third and fourth side surfaces of the second protective layer 930 may be located between the first and second side surfaces. In this case, the first outer cover member 910 may surround the first side surface, the third side surface, and the fourth side surface of the second protective layer 930, and the first outer cover member 910 may not surround the second side surface of the second protective layer 930 (see FIG. 1).

Similarly, the third protective layer 950 may include first, second, third, and fourth side surfaces. The first side surface of the third protective layer 950 may be adjacent to the boundary between the second display area 12 and the fourth display area 14. The second side surface of the third protective layer 950 may face the first side surface while being adjacent to the boundary between the third display area 13 and the first display area 11. The third and fourth side surfaces of the third protective layer 950 may be located between the first and second side surfaces. In this case, the first outer cover member 910 may surround the third side surface and the fourth side surface of the third protective layer 950, and the first outer cover member 910 may not surround the first and second side surfaces of the third protective layer 950.

In other words, the first outer cover member 910 may fix the first, third, and fourth side surfaces of the second protective layer 930 and the third and fourth side surfaces of the third protective layer 950. In addition, while the first outer cover member 910 covers the first, third, and fourth side surfaces of the second protective layer 930 and the third and fourth side surfaces of the third protective layer 950, the first outer cover member 910 may cover the inner cover member 810. In other embodiments, the first outer cover member 910 may surround all the first, second, third, and fourth side surfaces of each of the second and third protective layers 930 and 950. However, when the first outer cover member 910 surrounds the second side surface of the second protective layer 930 and the first and second side surfaces of the third protective layer 950, a bezel may be visually recognized between the second display area 12 and the fourth display area 14, between the second display area 12 and the third display area 13, and between the third display area 13 and the first display area 11.

The inner cover member 810 may include steel use stainless (SUS), plastic, and the like. However, a material of the first outer cover member 910 is not limited to the above materials. For example, the first outer cover member 910 may include materials capable of protecting the second protective layer 930, the third protective layer 950, and the inner cover member 810.

The fourth protective layer 840 may be disposed on the display panel 200 that overlaps the fourth display area 14. For example, the fourth protective layer 840 may have a flat shape in the fourth display area 14. In other words, the fourth protective layer 840 may have a bar shape. In embodiments, the fourth protective layer 840 may be in contact with the display panel 200. In some embodiments, the fourth protective layer 840 may be fixed to the display panel 200. When the display panel 200 is unfolded, the fourth protective layer 840 and the first protective layer 830 may be in contact each other at the boundary between the second display area 12 and the fourth display area 14.

The fourth protective layer 840 may be transparent, and the fourth protective layer 840 may include tempered glass, ultra-thin glass (UTG), and the like. However, a material of the fourth protective layer 840 is not limited to the above materials. For example, the fourth protective layer 840 may include materials that are transparent and capable of protecting the display panel 200.

The second outer cover member 820 may be connected to the hinge member 510, and may cover an outer periphery of each of the display panel 200 and the fourth protective layer 840 that overlap the fourth display area 14.

In embodiments, the second outer cover member 820 may be connected to at least one side surface of the fourth protective layer 840 so that the second outer cover member 820 may fix the fourth protective layer 840. For example, the fourth protective layer 840 may include first, second, third, and fourth side surfaces. The first side surface of the fourth protective layer 840 may be adjacent to the boundary between the second display area 12 and the fourth display area 14. The second side surface of the fourth protective layer 840 may face the first side surface. The third and fourth side surfaces of the fourth protective layer 840 may be located between the first and second side surfaces. In this case, the second outer cover member 820 may surround the second side surface, the third side surface, and the fourth side surface of the fourth protective layer 840. The second outer cover member 820 may not surround the first side surface of the fourth protective layer 840. In other words, the second outer cover member 820 may fix the second side surface, the third side surface, and the fourth side surface of the fourth protective layer 840. In addition, while the second outer cover member 820 covers the second side surface, the third side surface, and the fourth side surface of the fourth protective layer 840, the second outer cover member 820 may cover the side surface of the display panel 200 located under the fourth protective layer 840, a side surface of the second support member 720 located under the display panel 200, and the like. In other embodiments, the second outer cover member 820 may surround all of the first, second, third, and fourth side surfaces of the fourth protective layer 840. However, when the second outer cover member 820 surrounds the first side surface, a bezel may be visually recognized between the second display area 12 and the fourth display area 14.

The second outer cover member 820 may include steel use stainless (SUS), plastic, and the like. However, a material of the second outer cover member 820 is not limited to the above materials. For example, the second outer cover member 820 may include materials capable of protecting the fourth protective layer 840, the display panel 200, and the second support member 720.

In embodiments, the display panel 200 may display an image through the fourth protective layer 840 in the fourth display area 14.

The hinge member 510 may be disposed on the bottom surface of the display panel 200 to overlap the boundary between the second display area 12 and the fourth display area 14. As described above, the first outer cover member 910 and the second outer cover member 820 may be connected to the hinge member 510, and the first and second outer cover members 910 and 820 may be opened and closed through the hinge member 510, so that the display panel 200 (e.g., the display device 100) may be folded and unfolded through the hinge member 510. For example, when the first and second outer cover members 910 and 820 are folded through the hinge member 510, the first and second outer cover members 910 and 820 may be in contact with each other (see FIG. 1). In addition, when the first and second outer cover members 910 and 820 are unfolded through the hinge member 510, the first and second outer cover members 910 and 820 may be arranged in the first direction D1. The hinge member 510 may include a material having a relatively low coefficient of friction. For example, the hinge member 510 may include steel use stainless (SUS), plastic, engineering plastic, Teflon, a mirror-finished metal, and the like. However, a material of the hinge member 510 is not limited to the above materials. For example, the hinge member 510 may include materials capable of protecting the second protective layer 930, the third protective layer 950, and the inner cover member 810.

The first support member 710 may be disposed on the bottom surface of the display panel 200 that overlaps the first, second, and third display areas 11, 12, and 13. In a portion that overlaps the first display area 11 and the third display area 13, a first surface (e.g., a bottom surface) of the first support member 710 may have a first concavo-convex structure 715, and a second surface (e.g., a top surface) of the first support member 710 may be in contact with the bottom surface of the display panel 200. In embodiments, the second surface of the first support member 710 may be fixed to the bottom surface of the display panel 200, and may have one bent portion (e.g., a portion in contact with the first rotation member 650). The first support member 710 may include a flexible metal, Teflon, a metal that is mirror-finished through lapping, polishing, chemical-mechanical polishing (CMP), grinding, cutting, machining, or the like, flexible plastic, engineering plastic such as polyacetal or polyoxymethylene (POM), and the like. However, a material of the first support member 710 is not limited to the above materials. For example, the first support member 710 may include materials capable of preventing the first concavo-convex structure 715 from being deformed. The first support member 710 may be capable of supporting the display panel 200. In other embodiments, the first support member 710 may include a multi joint member. For example, the multi joint member may have a plurality of segment patterns, a plurality of connection patterns, and the like, and the segment patterns may be connected to each other by the connection patterns. The multi joint member may be easily bent on a curved surface of the first rotation member 650 through the segment patterns.

The first rotation member 650 may be disposed under the first support member 710 that overlaps the third display area 13. The first rotation member 650 may have a second concavo-convex structure engaged with the first concavo-convex structure 715, and may be configured to rotate in the clockwise direction. For example, a first shaft passing through a center of the first rotation member 650 and extending in a second direction D2 that is substantially orthogonal to the first direction D1 may be connected to the inner cover member 810, and the first rotation member 650 may be configured to rotate about the second direction D2. The first rotation member 650 may include steel use stainless (SUS), Teflon, a metal that is mirror-finished through lapping, polishing, chemical-mechanical polishing (CMP), grinding, cutting, machining, or the like, plastic, engineering plastic such as polyacetal or polyoxymethylene (POM), and the like. However, a material of the first rotation member 650 is not limited to the above materials. For example, the first rotation member 650 may include materials capable of preventing the second concavo-convex structure from being deformed.

The second support member 720 may be disposed on the bottom surface of the display panel 200 that overlaps the fourth display area 14. A first surface (e.g., a top surface) of the second support member 720 may be in contact with the bottom surface of the display panel 200. In embodiments, the first surface of the second support member 720 may be fixed to the bottom surface of the display panel 200. The second support member 720 may include a flexible metal, flexible plastic, and the like. However, a material of the second support member 720 is not limited to the above materials. For example, the second support member 720 may include materials capable of supporting the display panel 200.

The second rotation member 610 may be spaced apart from an end of the display panel 200 that overlaps the first display area 11. The second rotation member 610 may be configured to rotate in the clockwise direction. For example, a second shaft passing through a center of the second rotation member 610 and extending in the second direction D2 may be connected to the first outer cover member 910, and the second rotation member 610 may be configured to rotate about the second direction D2. The second rotation member 610 may include steel use stainless (SUS), Teflon, a metal that is mirror-finished through lapping, polishing, chemical-mechanical polishing (CMP), grinding, cutting, machining, or the like, plastic, engineering plastic such as polyacetal or polyoxymethylene (POM), and the like. However, a material of the second rotation member 610 is not limited to the above materials. For example, the second rotation member 610 may include materials capable of supporting the cover film 630.

The cover film 630 may be wound around the second rotation member 610. For example, one side of the cover film 630 may be connected to the second rotation member 610, and an opposite side of the cover film 630 may be connected to the end of the display panel 200. The cover film 630 may include flexible plastic, a flexible film, and the like. However, a material of the cover film 630 is not limited to the above materials. For example, the cover film 630 may include materials capable of preventing deformation when pulled with a predetermined force.

The circuit board 530 may be disposed on the first support member 710 located in the first display area 11. The circuit board 530 may be configured to generate signals for driving the display panel 200. For example, the circuit board 530 may include a printed circuit board (PCB) and the like, and an application processor (AP), a driver integrated circuit (IC) chip, and the like may be mounted on the circuit board 530.

The connection film 535 may be adjacent to the circuit board 530 and the end of the display panel 200. The connection film 535 may electrically connect the circuit board 530 to the display panel 200, and may provide the signals generated from the circuit board 530 to the display panel 200. The connection film 535 may include a flexible printed circuit board (FPCB), a flexible flat cable (FFC), and the like.

Figure 4:
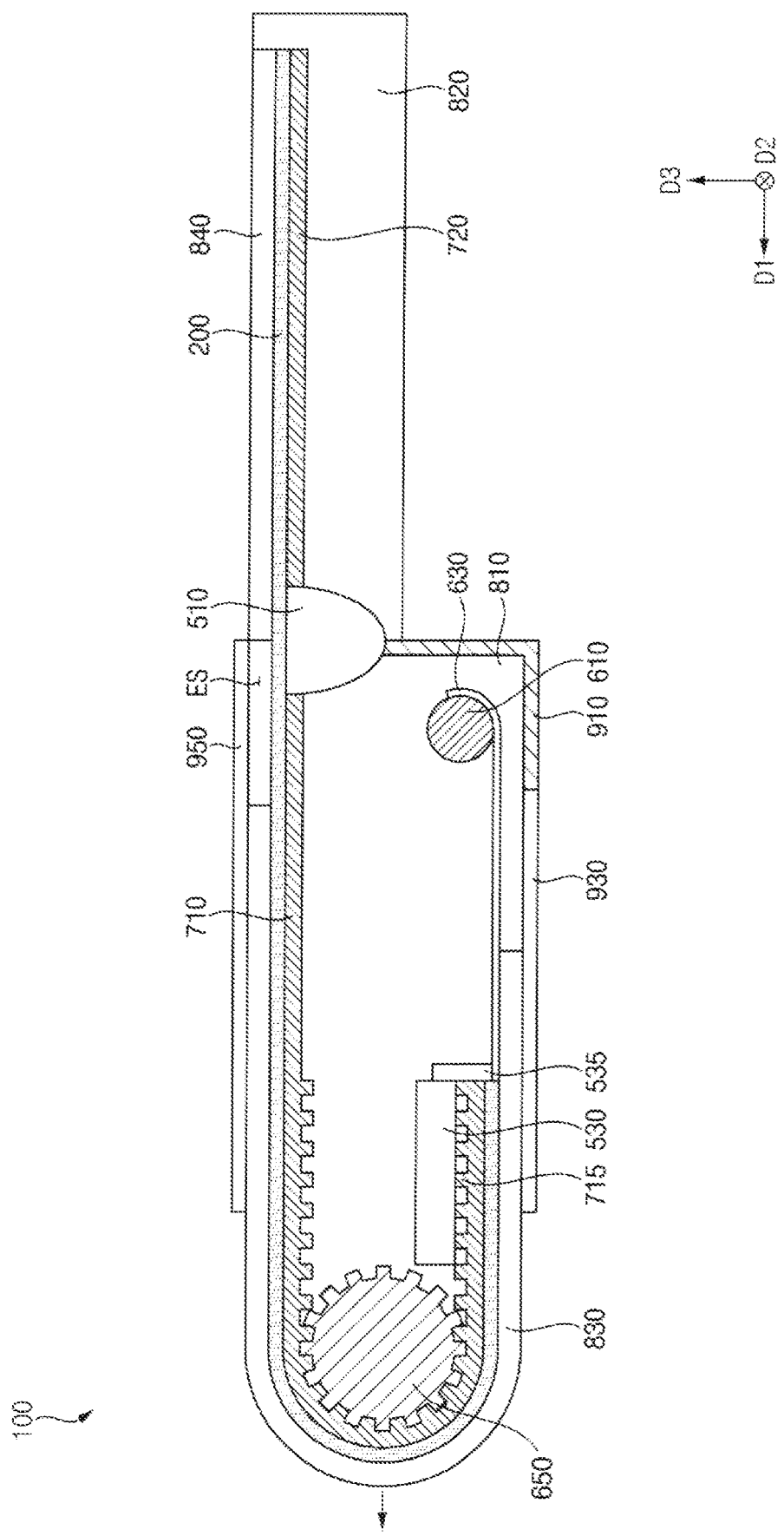
FIG. 4 is a cross-sectional view showing a state in which an inner cover member included in the display device of FIG. 3 is drawn out.

FIG. 4 is a cross-sectional view showing a state in which an inner cover member included in the display device of FIG. 3 is drawn out.

Referring to FIG. 4, the inner cover member 810 of the display device 100 may be drawn in to and out from the first outer cover member 910.

When the inner cover member 810 is drawn out from the first outer cover member 910 in the first direction D1, the display panel 200 may be configured to slip (e.g., slide) on the bottom surface of the first protective layer 830. In other words, a top surface of the first protective layer 830 may be in contact with a bottom surface of each of the second and third protective layers 930 and 950, and when the inner cover member 810 is drawn out from the first outer cover member 910 in the first direction D1, the first protective layer 830 may be configured to slide on the bottom surface of each of the second and third protective layers 930 and 950.

In embodiments, compared with FIG. 3, when the inner cover member 810 is drawn out from the first outer cover member 910 in the first direction D1 while the display panel 200 is unfolded, a protruding area of the first protective layer 830, which is exposed from the second and third protective layers 930 and 950, may be relatively increased.

In addition, when the inner cover member 810 is drawn out from the first outer cover member 910 in the first direction D1 while the display panel 200 is unfolded, a side surface of the first protective layer 830 may be spaced apart from a side surface of the fourth protective layer 840, and an empty space ES defined by the side surfaces may be created.

Moreover, when the inner cover member 810 is drawn out from the first outer cover member 910 in the first direction D1 while the display panel 200 is unfolded, the first rotation member 650 may be configured to rotate in the clockwise direction. Thus, the display panel 200 overlapping the first display area 11 may be moved to the third display area 13, and the display panel 200 overlapping the third display area 13 may be moved to the second display area 12. Further, when the inner cover member 810 is drawn out from the first outer cover member 910 in the first direction D1 while the display panel 200 is unfolded, the second rotation member 610 may be configured to rotate in the clockwise direction such that the cover film 630 drawn out from the second rotation member 610 in the first direction D1 to overlap the first display area 11.

For example, when the display device 100 is folded, the inner cover member 810 may be drawn out from the first outer cover member 910. In this case, even when the display device 100 is folded, an area for displaying an image may be relatively increased.

According to the display device 100 of embodiments, when the display device 100 is folded, an image may be displayed through the display panel 200 located in the first display area 11 and the third display area 13. In addition, when the display device 100 is unfolded, an image may be displayed through the display panel 200 located in the first display area 11, the third display area 13, the second display area 12, and the fourth display area 14. Moreover, when the inner cover member 810 is slid from the first outer cover member 910, an area for displaying an image in a third direction D3 that is orthogonal to the first and second directions D1 and D2 may be relatively increased. Accordingly, the display device 100 may function as a foldable display device and a slidable display device.

In addition, according to the display device 100, one display panel 200 may be disposed in the first, second, third, and fourth display areas 11, 12, 13, and 14. In this case, when the display device 100 is folded, the display panel 200 may be used to display an image in the first display area 11 and the third display area 13 without adding a display panel for displaying the image in the first display area 11 and the third display area 13, so that a manufacturing cost of the display device 100 may be relatively reduced.

Moreover, since the image is displayed from the display panel 200 that overlaps the third display area 13, the image may also be displayed on a curved side surface of the display device 100.

According to embodiments, the display panel 200 may include the first display area 11, the second display area 12, the third display area 13 having a curved shape, and the fourth display area 14. For example, the second display area 12 and the fourth display area 14 may display an image in the third direction D3. The third display area 13 may display the image on a curved surface thereof (e.g., in the first direction D1). The first display area 11 may display the image in a direction opposite to the third direction D3. For example, the rotation member 650 may modify a size of the first display area 11 and a size of the second display area 12 and may be disposed on the third display area 13. For example, the hinge member 510 may fold and unfold the fourth display area 14 and may be disposed on the boundary between the second display area 12 and the fourth display area 14. For example, when the first rotation member 650 is rotated in the clockwise direction, the size of the first display area 11 is decreased by the rotation of the rotation member 650, and the size of the second display area 12 is increased by the rotation of the rotation member 650. For example, when the first rotation member 650 is rotated in the counterclockwise direction, the size of the first display area 11 is increased by the rotation of the rotation member 650, and the size of the second display area 12 is decreased by the rotation of the rotation member 650.

Figure 5:
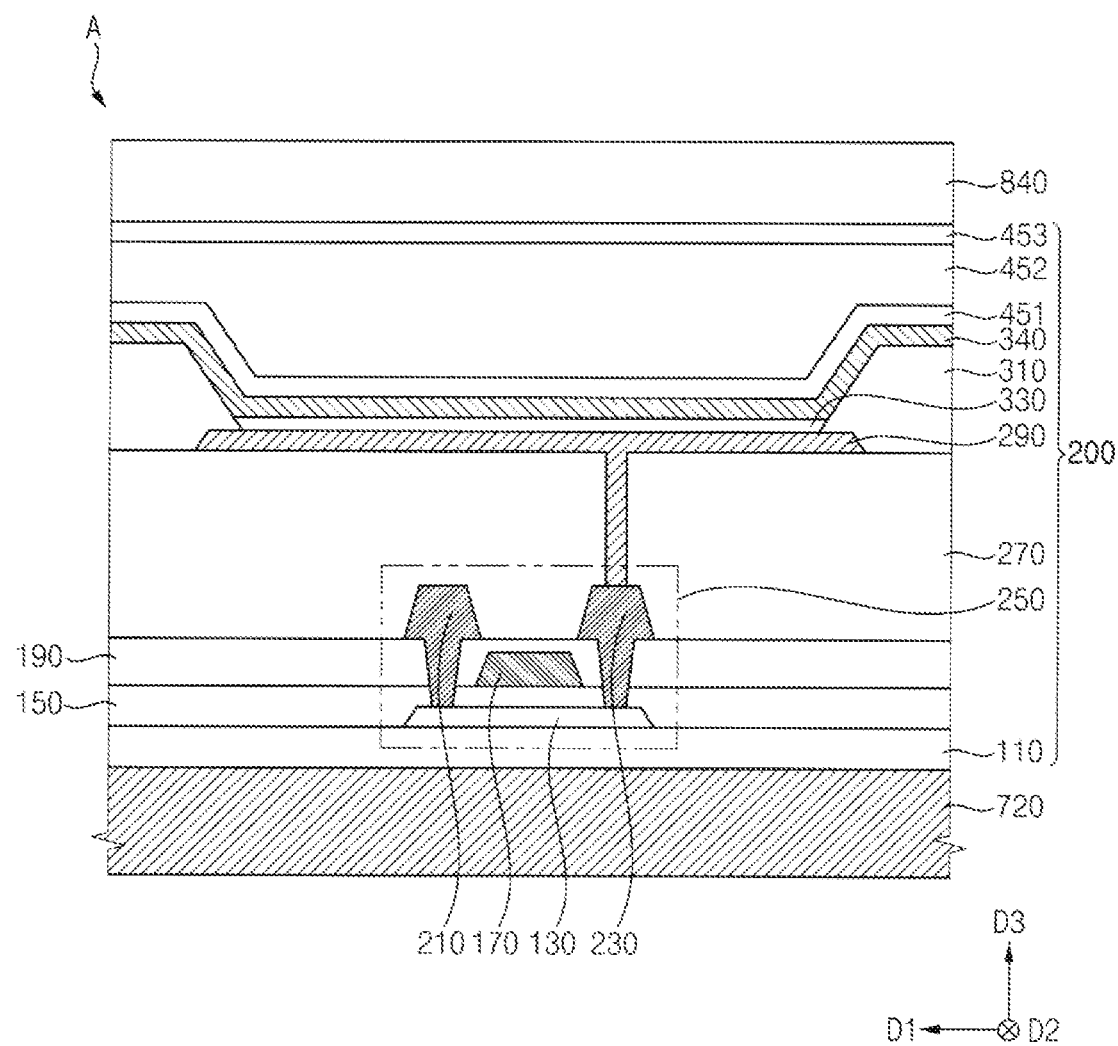
FIG. 5 is an enlarged cross-sectional view showing a region A of FIG. 3.

FIG. 5 is an enlarged cross-sectional view showing a region A of FIG. 3.

Referring to FIG. 5, the display panel 200 may include a substrate 110, a semiconductor element 250, a planarization layer 270, a lower electrode 290, a pixel defining layer 310, a light emitting layer 330, an upper electrode 340, a first inorganic thin film encapsulation layer 451, an organic thin film encapsulation layer 452, a second inorganic thin film encapsulation layer 453, and the like. The semiconductor element 250 may include an active layer 130, a gate insulating layer 150, a gate electrode 170, an interlayer insulating layer 190, a source electrode 210, and a drain electrode 230.

The substrate 110 including a transparent or opaque material may be provided. The substrate 110 may be disposed on the second support member 720 or the first support member 710. The substrate 110 may be in the form of a transparent resin substrate. For example, the transparent resin substrate may include a polyimide substrate. The polyimide substrate may include a first polyimide layer including an organic insulating material, a barrier film layer including an inorganic insulating material, a second polyimide layer including an organic insulating material, and the like.

A buffer layer may be disposed on the substrate 110. The buffer layer may prevent metal atoms or impurities from diffusing from the substrate 110 to the semiconductor element 250, and may control a heat transfer rate during a crystallization process for forming the active layer to form a substantially uniform active layer. In addition, when a surface of the substrate 110 is not uniform, the buffer layer may be used to improve flatness of the surface of the substrate 110. According to a type of the substrate 110, at least two buffer layers may be provided on the substrate 110, or the buffer layer may not be provided. For example, the buffer layer may include an organic insulating material or an inorganic insulating material.

The active layer 130 may be disposed on the substrate 110. The active layer 130 may include a metal oxide semiconductor, an inorganic semiconductor (e.g., amorphous silicon or poly silicon), an organic semiconductor, or the like. The active layer 130 may have source and drain regions.

The gate insulating layer 150 may be disposed on the active layer 130. For example, the gate insulating layer 150 may entirely or partially cover the active layer 130 on the substrate 110, and may have a substantially flat top surface and may not have a step around the active layer 130. In some embodiments, the gate insulating layer 150 may be disposed along a profile of the active layer 130 with a uniform thickness to cover the active layer 130 on the substrate 110. The gate insulating layer 150 may include a silicon compound, metal oxide, and the like. For example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. In other embodiments, the gate insulating layer 150 may have a multilayer structure including a plurality of insulating layers. For example, the insulating layers may have mutually different thicknesses, or may include mutually different materials.

The gate electrode 170 may be disposed on the gate insulating layer 150. The gate electrode 170 may be disposed on a portion of the gate insulating layer 150 under which the active layer 130 is disposed. The gate electrode 170 may include a metal, an alloy, metal nitride, conductive metal oxide, a transparent conductive material, and the like. For example, the gate electrode 170 may include Au, Ag, Al, Pt, Ni, Ti, Pd, Mg, Ca, Li, Cr, Ta, W, Cu, Mo, Sc, Nd, Ir, an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin OXide (ITO), tin oxide ($SnO_x$), indium oxide ($InO_x$), gallium oxide ($GaO_x$), indium zinc oxide (IZO), and the like. These materials may be used alone or in combination with each other. In other embodiments, the gate electrode 170 may include a multilayer structure including a plurality of metal layers. For example, the metal layers may have mutually different thicknesses, or may include mutually different materials.

The interlayer insulating layer 190 may be disposed on the gate electrode 170. For example, the interlayer insulating layer 190 may entirely or partially cover the gate electrode 170 on the gate insulating layer 150, and may have a substantially flat top surface and may not have a step around the gate electrode 170. In some embodiments, the interlayer insulating layer 190 may be disposed along a profile of the gate electrode 170 with a uniform thickness to cover the gate electrode 170 on the gate insulating layer 150. The interlayer insulating layer 190 may include a silicon compound, metal oxide, and the like. In some embodiments, the interlayer insulating layer 190 may have a multilayer structure including a plurality of insulating layers. For example, the insulating layers may have mutually different thicknesses, or may include mutually different materials.

The source electrode 210 and the drain electrode 230 may be disposed on the interlayer insulating layer 190. The source electrode 210 may be connected to the source region of the active layer 130 through a contact hole formed by removing first portions of the gate insulating layer 150 and the interlayer insulating layer 190. The drain electrode 230 may be connected to the drain region of the active layer 130 through a contact hole formed by removing second portions of the gate insulating layer 150 and the interlayer insulating layer 190. Each of the source electrode 210 and the drain electrode 230 may include a metal, an alloy, metal nitride, conductive metal oxide, a transparent conductive material, and the like. These materials may be used alone or in combination with each other. In other embodiments, each of the source electrode 210 and the drain electrode 230 may have a multilayer structure including a plurality of metal layers. For example, the metal layers may have mutually different thicknesses, or may include mutually different materials.

Accordingly, the semiconductor element 250 including the active layer 130, the gate insulating layer 150, the gate electrode 170, the interlayer insulating layer 190, the source electrode 210, and the drain electrode 230 may be provided.

However, although the semiconductor element 250 has been described as having a top gate structure, the configurations of embodiments are not limited thereto. For example, the semiconductor element 250 may have a bottom gate structure, a double (e.g., dual) gate structure, or the like.

In addition, although the display device 100 has been described as including one semiconductor element, the configurations of embodiment are not limited thereto. For example, the display device 100 may include at least one semiconductor element and at least one storage capacitor.

The planarization layer 270 may be disposed on the interlayer insulating layer 190, the source electrode 210, and the drain electrode 230. For example, the planarization layer 270 may have a relatively thick thickness. In this case, the planarization layer 270 may have a substantially flat top surface. In order to implement such a flat top surface of the planarization layer 270, a planarization process may be additionally performed on the planarization layer 270. In some embodiments, the planarization layer 270 may be disposed along a profile of the source electrode 210 and the drain electrode 230 with a uniform thickness on the interlayer insulating layer 190. The planarization layer 270 may be formed of an organic insulating material or an inorganic insulating material. In embodiments, the planarization layer 270 may include an organic insulating material. For example, the planarization layer 270 may include a photoresist, a polyacrylic-based resin, a polyimide-based resin, a polyamide-based resin, a siloxane-based resin, an acryl-based resin, an epoxy-based resin, and the like.

The lower electrode 290 may be disposed on the planarization layer 270. The lower electrode 290 may be connected to the drain electrode 230 through a contact hole formed by removing a portion of the planarization layer 270. For example, the lower electrode 290 may be electrically connected to the semiconductor element 250. The lower electrode 290 may include a metal, an alloy, metal nitride, conductive metal oxide, a transparent conductive material, and the like. These materials may be used alone or in combination with each other. In other embodiments, the lower electrode 290 may have a multilayer structure including a plurality of metal layers. For example, the metal layers may have mutually different thicknesses, or may include mutually different materials.

The pixel defining layer 310 may be disposed on the planarization layer 270. For example, the pixel defining layer 310 may cover both side portions of the lower electrode 290 while exposing a part of a top surface of the lower electrode 290. The pixel defining layer 310 may be formed of an organic insulating material or an inorganic insulating material. In embodiments, the pixel defining layer 310 may include an organic insulating material.

The light emitting layer 330 may be disposed on the pixel defining layer 310 and the lower electrode 290. The light emitting layer 330 may be formed by using at least one of light emitting materials for emitting different color lights (e.g., a red light, a green light, a blue light, etc.) according to pixels. Alternatively, the light emitting layer 330 may be formed by stacking a plurality of light emitting materials for generating different color lights such as a red light, a green light, and a blue light to emit a white light as a whole. In this case, a color filter may be disposed on the light emitting layer 330 disposed on the lower electrode 290. The color filter may include at least one of a red color filter, a green color filter, and a blue color filter. In some embodiments, the color filter may include a yellow color filter, a cyan color filter, and a magenta color filter. The color filter may include a photosensitive resin or a color photoresist.

The upper electrode 340 may be disposed on the light emitting layer 330 and the pixel defining layer 310. The upper electrode 340 may include a metal, an alloy, metal nitride, conductive metal oxide, a transparent conductive material, and the like. These materials may be used alone or in combination with each other. In other embodiments, the upper electrode 340 may have a multilayer structure including a plurality of metal layers. For example, the metal layers may have mutually different thicknesses, or may include mutually different materials.

The first inorganic thin film encapsulation layer 451 may be disposed on the upper electrode 340. The first inorganic thin film encapsulation layer 451 may be disposed along a profile of the upper electrode 340 with a uniform thickness to cover the upper electrode 340. The first inorganic thin film encapsulation layer 451 may prevent the light emitting layer 330 from deteriorating due to penetration of moisture, oxygen, and the like. In addition, the first inorganic thin film encapsulation layer 451 may perform a function of protecting the display panel 200 from an external impact. The first inorganic thin film encapsulation layer 451 may include an inorganic insulating material having flexibility.

The organic thin film encapsulation layer 452 may be disposed on the first inorganic thin film encapsulation layer 451. The organic thin film encapsulation layer 452 may improve flatness of the display panel 200, and may protect the display panel 200. The organic thin film encapsulation layer 452 may include an organic insulating material having flexibility.

The second inorganic thin film encapsulation layer 453 may be disposed on the organic thin film encapsulation layer 452. The second inorganic thin film encapsulation layer 453 may be disposed along a profile of the organic thin film encapsulation layer 452 with a uniform thickness to cover the organic thin film encapsulation layer 452. The second inorganic thin film encapsulation layer 453 may prevent the light emitting layer 330 from deteriorating due to the penetration of moisture, oxygen, and the like together with the first inorganic thin film encapsulation layer 451. In addition, the second inorganic thin film encapsulation layer 453 may perform a function of protecting the display panel 200 from an external impact together with the first inorganic thin film encapsulation layer 451 and the organic thin film encapsulation layer 452. The second inorganic thin film encapsulation layer 453 may include an inorganic insulating material having flexibility.

Accordingly, the display panel 200 may include the substrate 110, the semiconductor element 250, the planarization layer 270, the lower electrode 290, the pixel defining layer 310, the light emitting layer 330, the upper electrode 340, the first inorganic thin film encapsulation layer 451, the organic thin film encapsulation layer 452, and the second inorganic thin film encapsulation layer 453.

Figure 6:
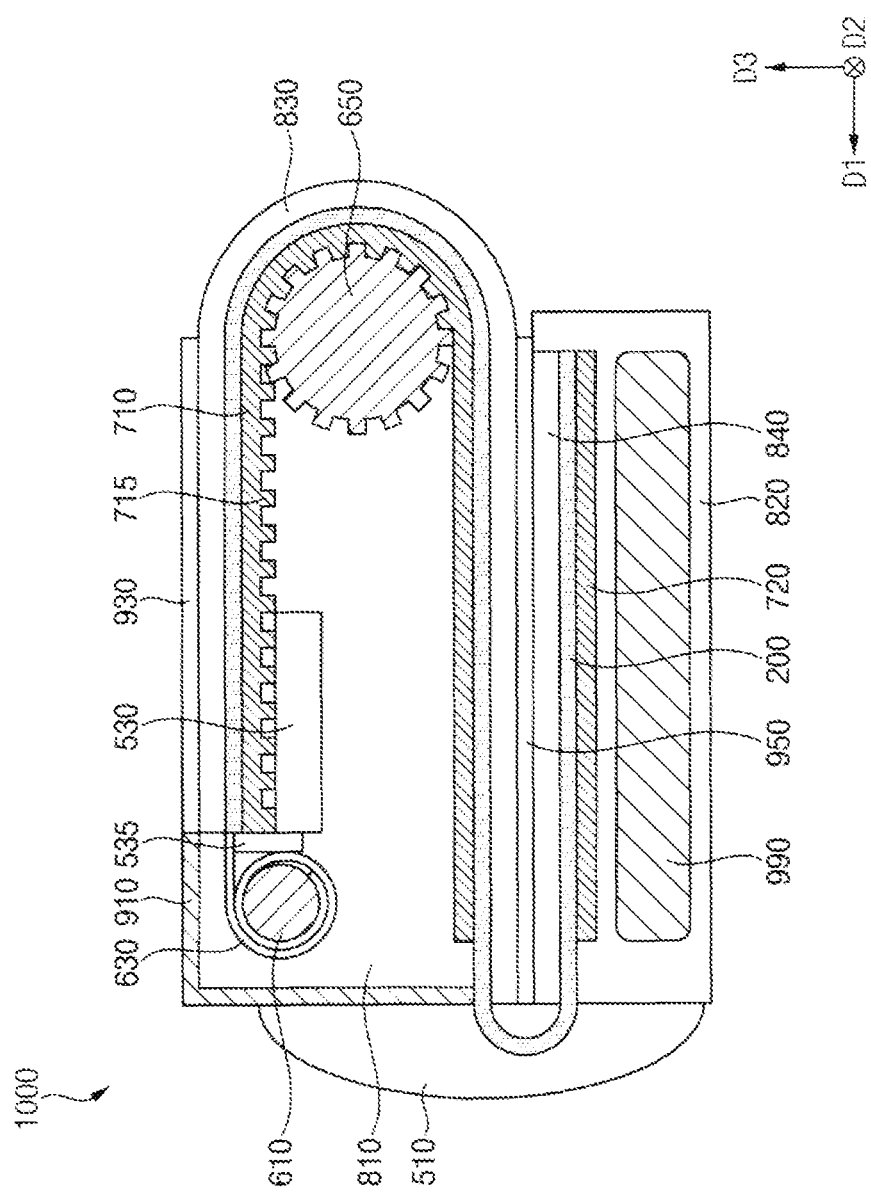
FIG. 6 is a cross-sectional view showing another embodiment of the display device of FIG. 1.

FIG. 6 is a cross-sectional view showing a display device according to embodiments. A display device 1000 illustrated in FIG. 6 may have a configuration that is substantially identical or similar to the configuration of the display device 100 described with reference to FIGS. 1, 2, 3, and 4 except for a power supply member 990. In FIG. 6, redundant descriptions of components that are substantially identical or similar to the components described with reference to FIGS. 1, 2, 3, and 4 will be omitted for descriptive convenience. For example, FIG. 6 shows a state in which the display device 1000 is folded.

Referring to FIG. 6, the display device 1000 may include a display panel 200, a first outer cover member 910, a second outer cover member 820, an inner cover member 810, a hinge member 510, a first protective layer 830, a second protective layer 930, a third protective layer 950, a fourth protective layer 840, a first support member 710, a second support member 720, a first rotation member 650, a second rotation member 610, a cover film 630, a circuit board 530, a connection film 535, a power supply member 990, and the like.

The power supply member 990 may be disposed under the second support member 720. In other words, the power supply member 990 may be disposed in an empty space located inside the second outer cover member 820. The display device 1000 may further include a motor to rotate the first rotation member 650 and the second rotation member 610. The display device 1000 may consume a relatively more power to drive the motor. In order to assist in the above configuration, the power supply member 990 may be provided in the display device 1000.

In other embodiments, a camera may be disposed in the empty space of the second outer cover member 820.

Figure 7:
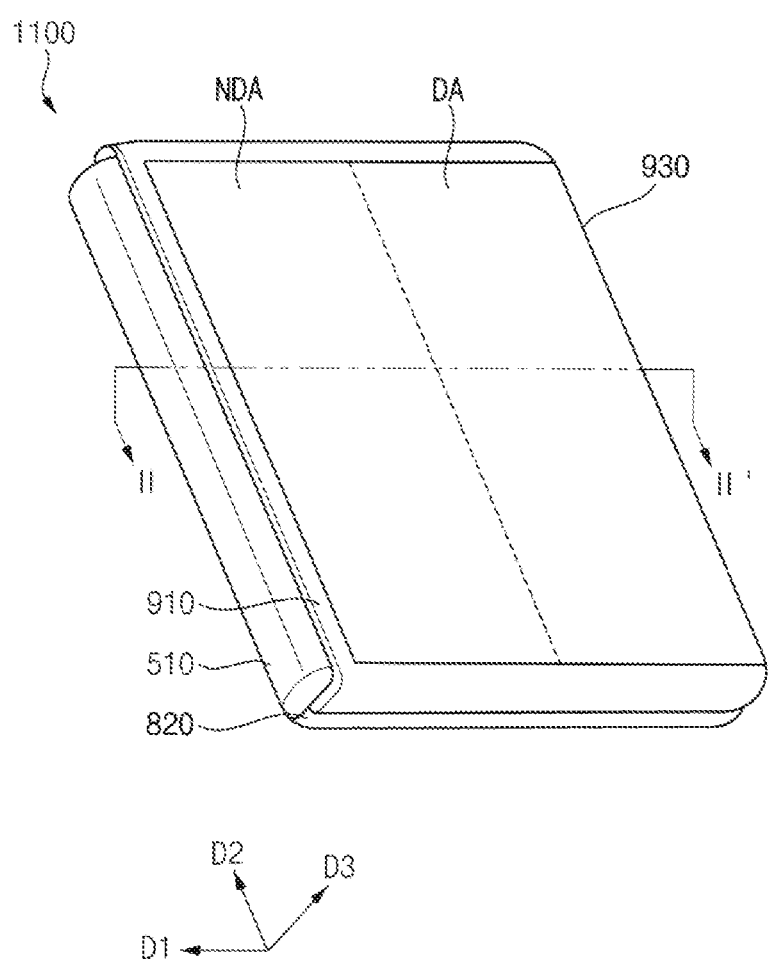
FIG. 7 is a perspective view of another embodiment of the display device of FIG.
Figure 8:
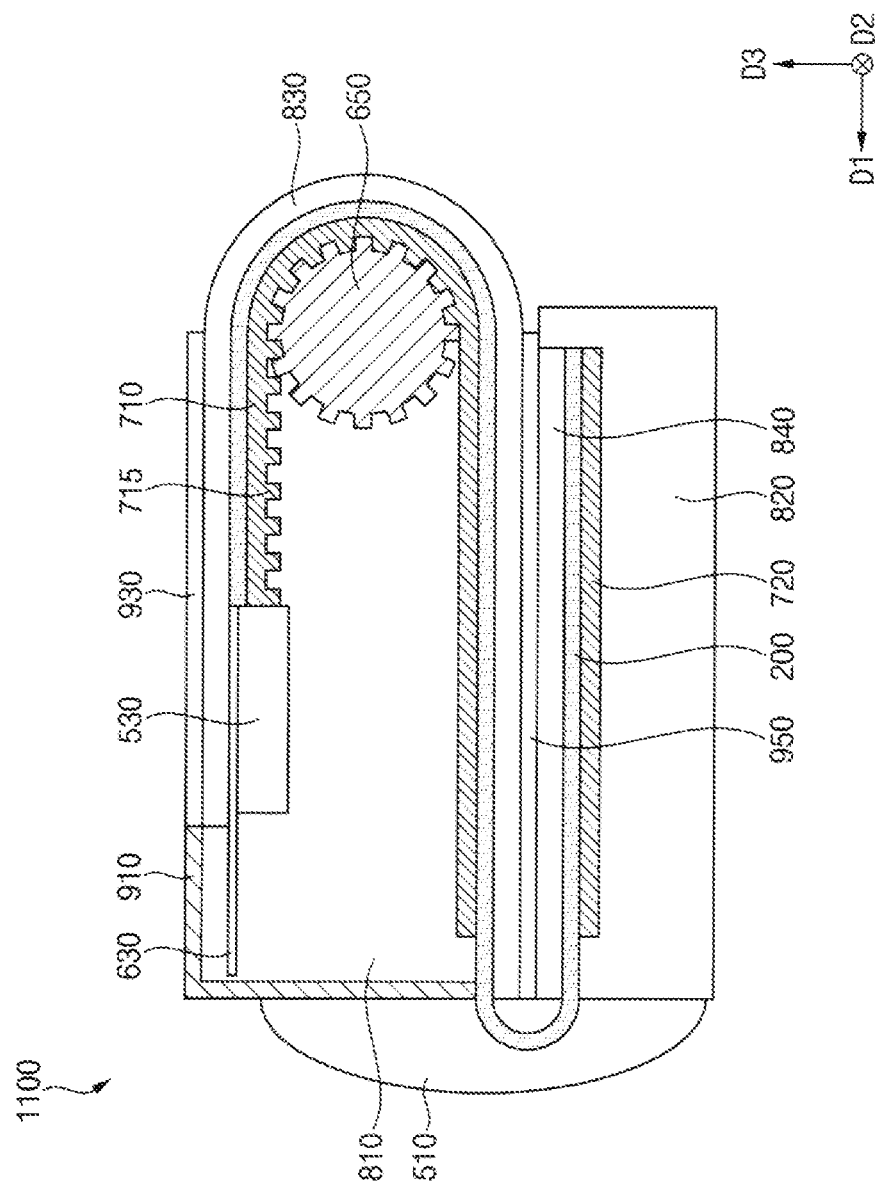
FIG. 8 is a cross-sectional view taken along line II-IF of FIG. 7.
Figure 9:
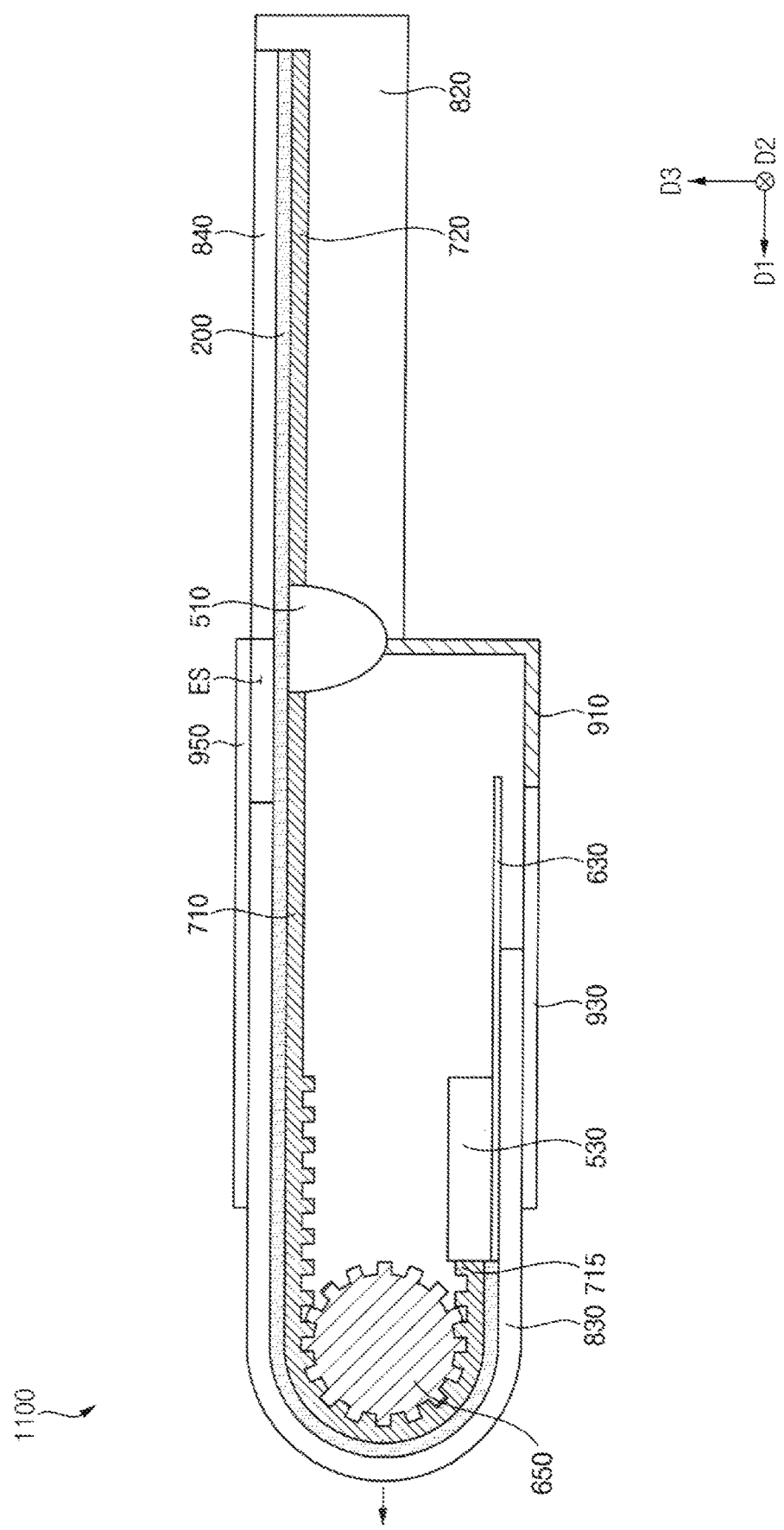
FIG. 9 is a cross-sectional view showing a state in which an inner cover member included in the display device of FIG. 8 is drawn out.

FIG. 7 is a perspective view showing a display device according to embodiments, and FIG. 8 is a cross-sectional view showing the display device of FIG. 7 taken along line FIG. 9 is a cross-sectional view showing a state in which an inner cover member included in the display device of FIG. 8 is drawn out. A display device 1100 illustrated in FIGS. 7, 8, and 9 may have a configuration that is substantially identical or similar to the configuration of the display device 100 described with reference to FIGS. 1, 2, 3, and 4. In FIGS. 7, 8, and 9, redundant descriptions of components that are substantially identical or similar to the components described with reference to FIGS. 1, 2, 3, and 4 will be omitted for descriptive convenience. For example, FIGS. 7 and 8 show a state in which the display device 1100 is folded. In addition, compared with the display device 100 of FIGS. 1, 2, 3, and 4, the display device 1100 does not include the second rotation member 610.

Referring to FIGS. 7, 8, and 9, the display device 1100 may include a display panel 200, a first outer cover member 910, a second outer cover member 820, an inner cover member 810, a hinge member 510, a first protective layer 830, a second protective layer 930, a third protective layer 950, a fourth protective layer 840, a first support member 710, a second support member 720, a first rotation member 650, a cover film 630, a circuit board 530, a connection film 535, and the like.

As shown in FIGS. 7 and 8, when the display device 1100 is folded, the cover film 630 may be disposed in a part of the first display area 11. In other words, a left portion of the first display area 11 may be defined as a non-display area NDA, and a right portion of the first display area 11 may be defined as a display area DA.

As shown in FIG. 9, when the inner cover member 810 slides from the first outer cover member 910 in the first direction D1, the cover film 630 may overlap the first display area 11, and the first display area 11 may be defined as the non-display area NDA.

Figure 10:
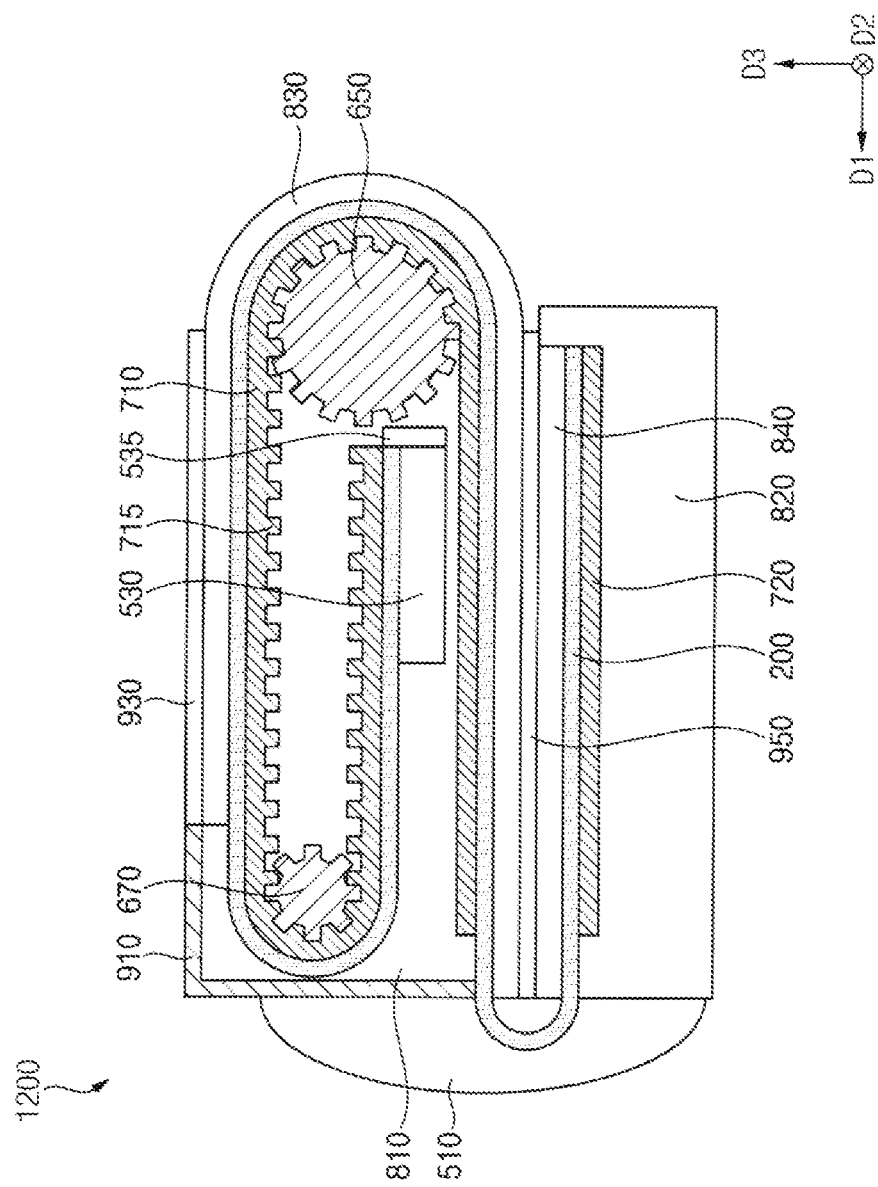
FIG. 10 is a cross-sectional view of another embodiment of the display device of FIG. 1.
Figure 11:
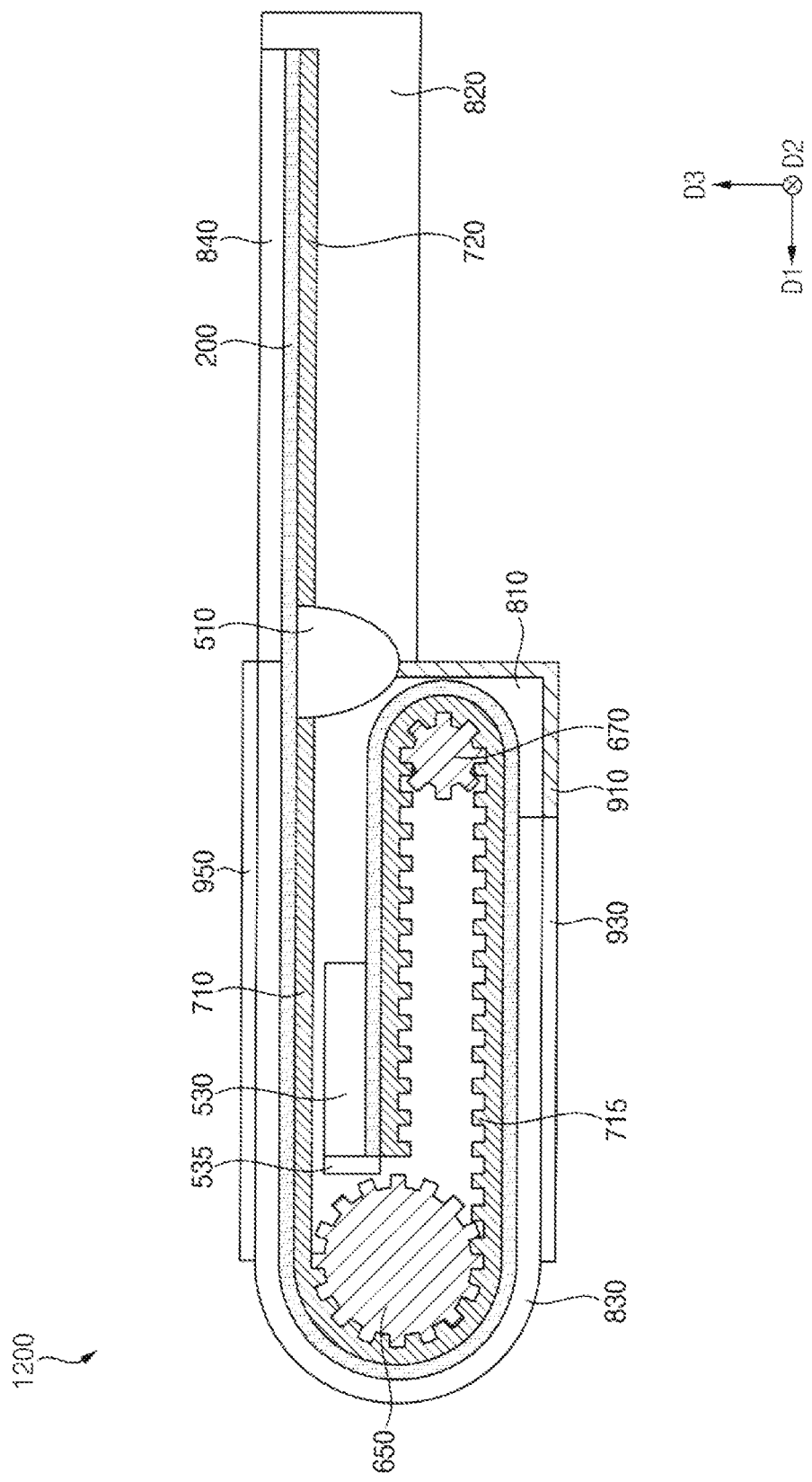
FIG. 11 is a cross-sectional view showing a state in which the display device of FIG. 10 is unfolded.
Figure 12:
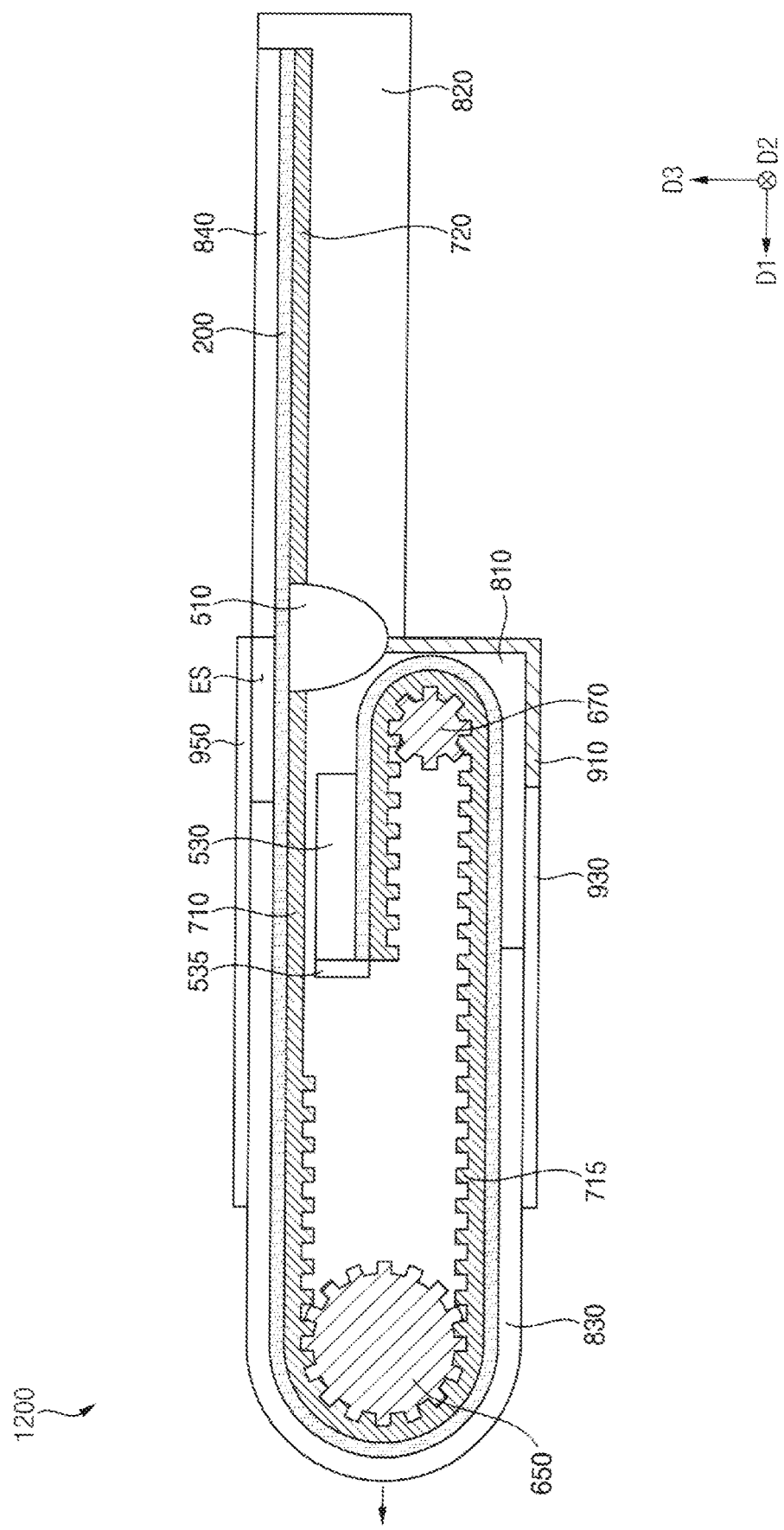
FIG. 12 is a cross-sectional view showing a state in which an inner cover member included in the display device of FIG. 11 is drawn out.

FIG. 10 is a cross-sectional view showing a display device according to embodiments, and FIG. 11 is a cross-sectional view showing a state in which the display device of FIG. 10 is unfolded. FIG. 12 is a cross-sectional view showing a state in which an inner cover member included in the display device of FIG. 11 is drawn out. A display device 1200 illustrated in FIGS. 10, 11, and 12 may have a configuration that is substantially identical or similar to the configuration of the display device 100 described with reference to FIGS. 1, 2, 3, and 4 except for a second rotation member 670. In FIGS. 10, 11, and 12, redundant descriptions of components that are substantially identical or similar to the components described with reference to FIGS. 1, 2, 3, and 4 will be omitted for descriptive convenience. For example, FIG. 10 shows a state in which the display device 1200 is folded.

Referring to FIGS. 10, 11, and 12, the display device 1200 may include a display panel 200, a first outer cover member 910, a second outer cover member 820, an inner cover member 810, a hinge member 510, a first protective layer 830, a second protective layer 930, a third protective layer 950, a fourth protective layer 840, a first support member 710, a second support member 720, a first rotation member 650, a second rotation member 670, a cover film 630, a circuit board 530, a connection film 535, and the like.

The first support member 710 may be disposed on the bottom surface of the display panel 200 that overlaps the first, second, and third display areas 11, 12, and 13. The first surface (e.g., the bottom surface) of the first support member 710 except for a portion in contact with the bottom surface of the display panel 200 disposed under the third protective layer 950 may have a first concavo-convex structure 715, and the second surface (e.g., the top surface) of the first support member 710 may be in contact with the bottom surface of the display panel 200. In embodiments, the second surface of the first support member 710 may be fixed to the bottom surface of the display panel 200, and the first support member 710 may have a G-shape or a 9 shape. In other words, the first support member 710 may have two bent portions (e.g., portions in contact with the first rotation member 650 and the second rotation member 670). For example, a part of the display panel 200 may be located in an empty space between the first rotation member 650 and the second rotation member 670.

The first support member 710 may include a flexible metal, Teflon, a metal that is mirror-finished through lapping, polishing, chemical-mechanical polishing (CMP), grinding, cutting, machining, or the like, flexible plastic, engineering plastic such as polyacetal or polyoxymethylene (POM), and the like. However, a material of the first support member 710 is not limited to the above materials. For example, the first support member 710 may include materials capable of preventing the first concavo-convex structure 715 from being deformed. The first support member 710 may be capable of supporting the display panel 200.

The first rotation member 650 may be disposed under the first support member 710 that overlaps the third display area 13. The first rotation member 650 may have a second concavo-convex structure engaged with the first concavo-convex structure 715, and may be configured to rotate in the clockwise direction. For example, a first shaft passing through a center of the first rotation member 650 and extending in a second direction D2 that is substantially orthogonal to the first direction D1 may be connected to the inner cover member 810, and the first rotation member 650 may be configured to rotate along an axis extending in the second direction D2. The first rotation member 650 may include steel use stainless (SUS), Teflon, a metal that is mirror-finished through lapping, polishing, chemical-mechanical polishing (CMP), grinding, cutting, machining, or the like, plastic, engineering plastic such as polyacetal or polyoxymethylene (POM), and the like. However, a material of the first rotation member 650 is not limited to the above materials. For example, the first rotation member 650 may include materials capable of preventing the second concavo-convex structure from being deformed.

The second rotation member 670 may be adjacent to the hinge member 510. The second rotation member 670 may have a third concavo-convex structure engaged with the first concavo-convex structure 715, and may be configured to rotate in the clockwise direction. For example, a second shaft passing through a center of the second rotation member 670 and extending in the second direction D2 may be connected to the inner cover member 810, and the second rotation member 670 may be configured to rotate along an axis extending in the second direction D2. The second rotation member 670 may include steel use stainless (SUS), Teflon, a metal that is mirror-finished through lapping, polishing, chemical-mechanical polishing (CMP), grinding, cutting, machining, or the like, plastic, engineering plastic such as polyacetal or polyoxymethylene (POM), and the like. However, a material of the second rotation member 670 is not limited to the above materials. For example, the second rotation member 670 may include materials capable of preventing the third concavo-convex structure from being deformed.

As shown in FIG. 12, the inner cover member 810 of the display device 1200 may be drawn in to and out from the first outer cover member 910.

When the inner cover member 810 is drawn out from the first outer cover member 910 in the first direction D1 while the display panel 200 is unfolded, the first rotation member 650 may be configured to rotate in the clockwise direction. Thus, the display panel 200 overlapping the first display area 11 may be moved to the third display area 13, and the display panel 200 overlapping the third display area 13 may be moved to the second display area 12. Further, when the inner cover member 810 is drawn out from the first outer cover member 910 in the first direction D1 while the display panel 200 is unfolded, the second rotation member 670 may be configured to rotate in the clockwise direction such that the part of the display panel 200 located in the empty space between the first rotation member 650 and the second rotation member 670 overlaps the first display area 11. In this case, even when the inner cover member 810 slides from the first outer cover member 910 in the first direction D1, the display panel 200 may be disposed over the whole first display area 11, and an image may be displayed over the whole first display area 11.

According to the display device 1200 of embodiments, when the inner cover member 810 slides from the first outer cover member 910, an area for displaying an image in the third direction D3 may be relatively increased. In addition, even when the inner cover member 810 slides from the first outer cover member 910, the image may be displayed over the whole first display area 11. Accordingly, the display device 1200 may function as a foldable display device and a slidable display device.

Moreover, since the image is displayed from the display panel 200 that overlaps the third display area 13, the image may also be displayed on a curved side surface of the display device 1200.

The embodiments may be applied to various electronic devices including a display device. For example, the embodiments may be applied to numerous electronic devices such as vehicle-display devices, ship-display devices, aircraft-display devices, portable communication devices, exhibition display devices, information transfer display devices, medical-display devices, etc.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device having a first display area, a second display area, a third display area, and a fourth display area, the third display area disposed between the first and second display areas and having a curved shape, the fourth display area disposed on one side of the second display area, the display device comprising:
   a display panel overlapping the first, second, third, and fourth display areas;
   an inner cover member covering an outer periphery of the display panel that overlaps the first, second, and third display areas;
   a first outer cover member surrounding the inner cover member; and
   a hinge member disposed on a bottom surface of the display panel to overlap a boundary between the second display area and the fourth display area, the hinge member connected to the first outer cover member,
   wherein:
      the hinge member is spaced apart from, and does not overlap, the third display area;
      the display panel is configured to be folded and unfolded through the hinge member; and
      the inner cover member is configured to be drawn in to and out from the first outer cover member.

2. The display device of claim 1, wherein the display device is configured to display an image in the third display area having the curved shape.

3. The display device of claim 1, further comprising:
   a second outer cover member connected to the hinge member and covering an outer periphery of the display panel that overlaps the fourth display area.

4. The display device of claim 3, wherein, when the first outer cover member and the second outer cover member are folded through the hinge member, the first outer cover member and the second outer cover member are in contact with each other, and,
   when the first outer cover member and the second outer cover member are unfolded through the hinge member, the first outer cover member and the second outer cover member are arranged in a first direction.

5. The display device of claim 3, further comprising:
   a power supply member disposed inside the second outer cover member.

6. The display device of claim 1, further comprising:
   a first protective layer disposed on the display panel to surround the display panel that overlaps the first, second, and third display areas.

7. The display device of claim 6, wherein the inner cover member is connected to at least one side surface of the first protective layer such that the inner cover member fixes the first protective layer.

8. The display device of claim 6, wherein the first protective layer has a curved shape in the third display area.

9. The display device of claim 6, wherein:
   a bottom surface of the first protective layer is in contact with the display panel, and,
      when the inner cover member is drawn out from the first outer cover member in a first direction, the display panel is configured to slide on the bottom surface of the first protective layer.

10. The display device of claim 6, further comprising:
    a second protective layer disposed on the first protective layer to overlap the first display area; and
    a third protective layer disposed on the first protective layer to overlap the second display area.

11. The display device of claim 10, wherein:
    the first outer cover member is connected to at least one side of the second protective layer such that the first outer cover member fixes the second protective layer, and
    the first outer cover member is connected to at least one side of the third protective layer such that the first outer cover member fixes the third protective layer.

12. The display device of claim 10, wherein the second protective layer and the third protective layer do not overlap the third display area, and
    the first protective layer protrudes through an opening defined by the second protective layer and the third protective layer.

13. The display device of claim 12, wherein, when the inner cover member is drawn out from the first outer cover member in a first direction while the display panel is unfolded, a protruding area of the first protective layer exposed from the second protective layer and the third protective layer is increased.

14. The display device of claim 10, wherein the display panel is configured to display an image through the first, second, and third protective layers in the first display area and the second display area, and
    the display panel is configured to display an image through the first protective layer in the third display area.

15. The display device of claim 10, wherein:
    a top surface of the first protective layer is in contact with a bottom surface of each of the second and third protective layers, and,
       when the inner cover member is drawn out from the first outer cover member in a first direction, the first protective layer is configured to slide on the bottom surface of each of the second and third protective layers.

16. The display device of claim 10, further comprising:
a second outer cover member connected to the hinge member and covering an outer periphery of the display panel that overlaps the fourth display area; and
a fourth protective layer disposed on the display panel that overlaps the fourth display area.

17. The display device of claim 16, wherein, when the display panel is unfolded, a side surface of the first protective layer and a side surface of the fourth protective layer be in contact with each other at the boundary between the second display area and the fourth display area.

18. The display device of claim 16, wherein, when the inner cover member is drawn out from the first outer cover member in a first direction while the display panel is unfolded, a side surface of the first protective layer is spaced apart from a side surface of the fourth protective layer.

19. The display device of claim 16, wherein the second outer cover member is connected to at least one side of the fourth protective layer such that the second outer cover member fixes the fourth protective layer.

20. The display device of claim 16, wherein the display panel is configured to display an image through the fourth protective layer in the fourth display area.

21. The display device of claim 1, further comprising:
a first support member disposed on the bottom surface of the display panel that overlaps the first, second, and third display areas.

22. The display device of claim 21, wherein a bottom surface of the first support member has a first concavo-convex structure in a portion that overlaps the first display area and the third display area, and
a top surface of the first support member is in contact with the bottom surface of the display panel.

23. The display device of claim 22, further comprising:
a first rotation member disposed under the first support member that overlaps the third display area and having a second concavo-convex structure engaged with the first concavo-convex structure of the first support member.

24. The display device of claim 21, further comprising:
a second support member disposed on the bottom surface of the display panel overlapping the fourth display area, wherein a top surface of the second support member is in contact with the bottom surface of the display panel.

25. The display device of claim 1, further comprising:
a first rotation member overlapping the third display area; and
a second rotation member spaced apart from an end of the display panel that overlaps the first display area.

26. The display device of claim 25, further comprising:
a cover film wound around the second rotation member, wherein one side of the cover film is connected to the second rotation member, and
an opposite side of the cover film is connected to the end of the display panel.

27. The display device of claim 26, wherein, when the inner cover member is drawn out from the first outer cover member in a first direction while the display panel is unfolded,
the first rotation member is configured to rotate in a clockwise direction such that the display panel overlapping the first display area is moved to the third display area, and the display panel overlapping the third display area is moved to the second display area, and
the second rotation member is configured to rotate in the clockwise direction such that a part of the cover film overlaps the first display area.

28. The display device of claim 1, wherein, when the display panel is unfolded, the first display area is used to display an image on a bottom surface of the display device, the second display area and the fourth display area are used to display an image on a top surface of the display device, and the third display area is used to display an image on a side surface of the display device.

29. The display device of claim 1, wherein the display panel is integrally formed in the first, second, third, and fourth display areas.

30. A display device having a first display area, a second display area, a third display area, a fourth display area, and a hinge area, the third display area disposed between the first and second display areas and having a curved shape, the fourth display area disposed on one side of the second display area, the hinge area disposed between the second display area and the fourth display area, the display device comprising:
a display panel that overlaps the first, second, third, and fourth display areas and the hinge area;
a first support member disposed on a bottom surface of the display panel and having a first extension area overlapping the first display area, a second extension area overlapping the third display area, and a support area overlapping the second display area;
a hinge member disposed in the hinge area on the bottom surface of the display panel; and
a first rotation member disposed in the second extension area on a bottom surface of the first support member, wherein:
the hinge member is spaced apart from, and does not overlap, the third display area;
the display panel is configured to be folded and unfolded through the hinge member; and
the display panel is configured to be drawn in and out through the first rotation member.

31. The display device of claim 30, wherein the display device is configured to display an image in the third display area having the curved shape.

32. The display device of claim 30, wherein the bottom surface of the first support member that overlaps the first extension area and the second extension area has a first concavo-convex structure,
the first rotation member has a second concavo-convex structure engaged with the first concavo-convex structure of the first support member, and
a top surface of the first support member is in contact with the bottom surface of the display panel.

33. The display device of claim 30, further comprising:
a second support member disposed in the fourth display area on the bottom surface of the display panel, wherein a top surface of the second support member is in contact with the bottom surface of the display panel.

34. The display device of claim 30, further comprising:
a second rotation member spaced apart from an end of the display panel that overlaps the first display area; and
a cover film wound around the second rotation member, wherein one side of the cover film is connected to the second rotation member, and
an opposite side of the cover film is connected to the end of the display panel.

35. The display device of claim 34, wherein, when the display panel is drawn out in a first direction while the display panel is unfolded, the first rotation member is configured to rotate in a clockwise direction such that a part of the first extension area of the first support member is moved to the third display area and a part of the second extension area of the first support member is moved to the second display area, and the second rotation member is configured to rotate in the clockwise direction such that a part of the cover film overlaps the first display area.

36. The display device of claim 30, wherein, when the display panel is unfolded, the first display area is used to display an image on a bottom surface of the display device, the second display area and the fourth display area are used to display an image on a top surface of the display device, and the third display area is used to display an image on a side surface of the display device.

37. The display device of claim 30, wherein the display panel is integrally formed in the first, second, third, and fourth display areas.

38. A display device comprising:

a display panel having a first display area, a second display area, a third display area having a curved shape, and a fourth display area;

a rotation member configured to modify a size of the first display area and a size of the second display area and disposed on the third display area; and a hinge member configured to fold and unfold the fourth display area and disposed on a boundary between the second display area and the fourth display area, wherein:

the first display area is configured to display an image in a first direction;

the second display area and the fourth display area are configured to display the image in a second direction opposite to the first direction, and the third display area is configured to display the image in a third direction, wherein:

the hinge member is spaced apart from, and does not overlap, the third display area;

the size of the first display area is decreased by a rotation of the rotation member; and the size of the second display area is increased by the rotation of the rotation member.

* * * * *